(12) United States Patent
Choi et al.

(10) Patent No.: US 7,929,308 B2
(45) Date of Patent: Apr. 19, 2011

(54) POWER DEVICE PACKAGE HAVING ENHANCED HEAT DISSIPATION

(75) Inventors: Sang Kuk Choi, Daejeon (KR); Hyun Tak Kim, Daejeon (KR); Byung Gyu Chae, Daejeon (DE); Bong Jun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 72 days.

(21) Appl. No.: 12/535,969

(22) Filed: Aug. 5, 2009

(65) Prior Publication Data
US 2010/0157542 A1 Jun. 24, 2010

(30) Foreign Application Priority Data
Dec. 22, 2008 (KR) .................. 10-2008-0131599

(51) Int. Cl.
H05K 7/20 (2006.01)
H01L 21/335 (2006.01)

(52) U.S. Cl. ............... 361/717; 361/679.54; 361/708; 361/719; 165/80.3; 174/16.3; 174/252; 257/2; 257/4; 257/E49.001; 257/E49.002; 257/310; 257/192

(58) Field of Classification Search ............ 361/679.46, 361/679.54, 702–712, 715–724; 174/15.1, 174/16.3, 252; 165/80.3, 104.33, 104.34, 165/185; 257/2, 4, 49, 192, 310, 324, 411, 257/467, E29, E49.001, E49.002, E23.082, 257/E29.255, 706–727, 930; 438/142, 85, 86, 95, 99, 104; 320/134, 154; 340/584, 595

See application file for complete search history.

(56) References Cited

U.S. PATENT DOCUMENTS

| | | | | |
|---|---|---|---|---|
| 3,436,604 | A * | 4/1969 | Luecke et al. | 361/715 |
| 3,826,924 | A * | 7/1974 | Plough et al. | 307/117 |
| 4,163,982 | A * | 8/1979 | Di Domenico et al. | 361/435 |
| 5,654,861 | A | 8/1997 | Pennisi | |
| 6,624,463 | B2 * | 9/2003 | Kim et al. | 257/310 |
| 7,608,849 | B2 * | 10/2009 | Ino et al. | 257/4 |
| 7,728,327 | B2 * | 6/2010 | Kim et al. | 257/49 |
| 7,767,501 | B2 * | 8/2010 | Youn et al. | 438/142 |
| 2006/0255392 | A1 * | 11/2006 | Cho et al. | 257/310 |
| 2007/0069192 | A1 * | 3/2007 | Odagawa et al. | 257/2 |
| 2009/0057820 | A1 * | 3/2009 | Kim et al. | 257/530 |
| 2010/0066411 | A1 * | 3/2010 | Lim et al. | 326/101 |
| 2010/0134936 | A1 * | 6/2010 | Kim et al. | 361/56 |

FOREIGN PATENT DOCUMENTS

| | | |
|---|---|---|
| EP | 0552625 A2 | 7/1993 |
| KR | 1020050043431 | 5/2005 |
| KR | 1020060117023 | 11/2006 |
| KR | 10-0825760 | 4/2008 |

* cited by examiner

*Primary Examiner* — Michael V Datskovskiy
(74) *Attorney, Agent, or Firm* — Rabin & Berdo, PC

(57) ABSTRACT

A power device package controls heat generation of a power device using a semi-permanent metal-insulator transition (MIT) device instead of a fuse, and emits heat generated by the power device through a small-sized heat sink provided only in one region on the power device, thereby ensuring excellent dissipation of heat. Therefore, the power device package can be usefully applied to any electric/electronic circuit that uses a power device.

9 Claims, 3 Drawing Sheets

POWER DEVICE PACKAGE HAVING ENHANCED HEAT DISSIPATION

CROSS-REFERENCE TO RELATED APPLICATION

This application claims priority to and the benefit of Korean Patent Application No. 10-2008-0131599, filed Dec. 22, 2008, the disclosure of which is incorporated herein by reference in its entirety.

BACKGROUND

1. Field of the Invention

The present invention relates to a power device package having enhanced heat dissipation, and more particularly, to a power device package that can effectively prevent heat generation of a power device by using an overheat prevention device that does not need to be replaced and a small-sized heat sink.

2. Discussion of Related Art

A power transistor is generally used in computerized industrial equipment as a device for controlling power. Such a power transistor generates much heat due to supply of power, and a fuse is connected to a base or a gate of the power transistor to protect the power transistor from the heat.

If the temperature of the power transistor reaches a certain dangerous value, the fuse is broken and the power transistor turns off and cools down.

However, although a system of expensive equipment can be protected only by breaking a cheap fuse, the fuse needs to be replaced after it is broken.

Meanwhile, in spite of their cheap price, replacement of fuses is time and cost consuming, and since equipment cannot be used until a fuse is replaced, enormous economic damage may be incurred. Therefore, research is being conducted into an overheat prevention device that can be used instead of a fuse, continuously without replacement, as well as a heat generation control circuit using the overheat prevention device and a method thereof.

Moreover, a current secondary battery charger needs a power transistor through which a current of at least 500 mA can flow, and then the temperature of the power transistor (TIP 29C, maximum current 2 A) increases to more than 150 degrees Celsius, for example, 140 degrees Celsius. Accordingly, an aluminum heat sink is used to protect the power system using a temperature fuse by dissipating generated heat.

However, the aluminum heat sink is larger than the power transistor, hampering miniaturization of a power system.

SUMMARY OF THE INVENTION

The present invention is directed to a power device package that can effectively prevent heat generation of a power device by using an overheat prevention device that does not need to be replaced and a small-sized heat sink.

In accordance with an aspect of the invention, there is provided a power device package having enhanced heat dissipation, including: a printed circuit board in which signal input terminals for applying signals are provided adjacent to lateral side surfaces; a power device mounted in a designated region of the printed circuit board to supply power; a metal-insulator transition (MIT) device attached to a heat generating part of the power device to control heat dissipation of the power device; and a heat sink provided in a region on the power device.

A plurality of first signal input terminals may be disposed adjacent to one of the lateral side surfaces of the printed circuit board, and a plurality of second signal input terminals may be disposed at positions opposite to the first signal input terminals.

When a plurality of power devices are mounted on the printed circuit board, the power devices may be arranged adjacent to each other only in a designated region of the printed circuit board, and the heat sink may be integrally formed across a region on the power devices, using the structure of the printed circuit board, heat generated by the power devices may be controlled through the MIT device and emitted to the outside using the heat sink.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
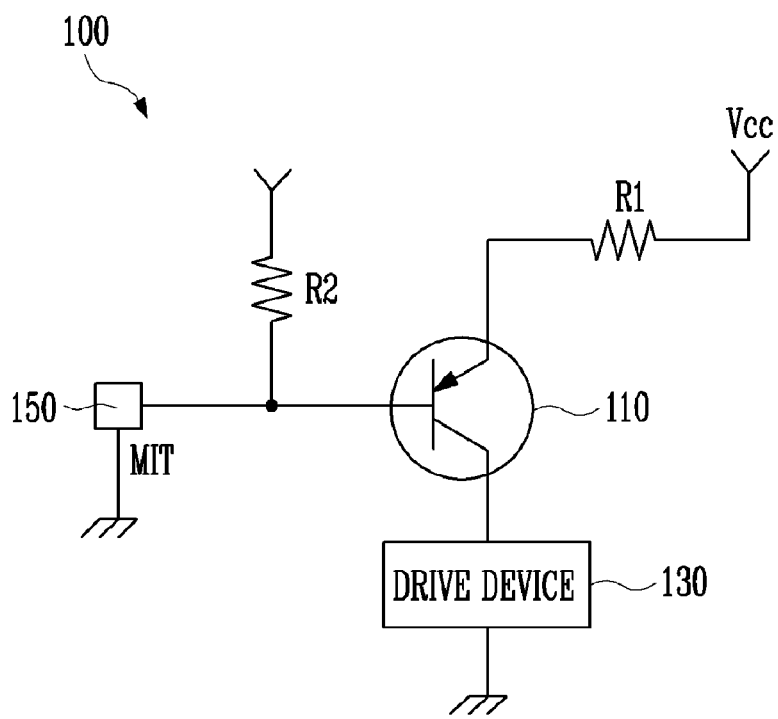
FIG. 1 is a view illustrating a heat dissipation control circuit of a power transistor in a power device package according to an exemplary embodiment of the invention.

Hereinafter, the present invention will be described with reference to the accompanying drawings in detail. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification. In the drawings, the thickness of layers and regions are exaggerated for clarity.

It should be understood that the present inventors have suggested a circuit for controlling heat generation of a power transistor using a semi-permanent metal-insulator transition (MIT) device instead of a fuse. The invention relates to a package structure that helps to reduce heat generated by a power transistor together with an MIT device when a heat generation control circuit of the power transistor is mounted on a printed circuit board. The heat generation control circuit of a power transistor using the MIT device suggested by the present inventors will be described to aid in understanding the invention.

FIG. 1 is a view illustrating a heat generation control circuit of a power transistor in a power device package according to an exemplary embodiment of the invention.

Referring to FIG. 1, a heat generation control circuit 100 of a power transistor includes a power transistor 110 supplying power to a drive device 130, and an MIT device 150 connected to a base of the power transistor 110 to control heat generation of the power transistor 110.

An emitter of the power transistor 110 is connected to a power source Vcc via a first resistor R1, and a base thereof is connected the power source Vcc via a second resistor R2. Here, resistances of the first and second resistors R1 and R2 are suitably adjusted according to the power source to properly operate the power transistor 110 and control the power supplied to the drive device 130.

As described above, the power transistor 110 generates heat during supply of power and occasionally malfunctions due to the generated heat. When the power transistor 110 malfunctions, the drive device 130 may be damaged or broken.

The MIT device 150 is attached to a heat generating part of the power transistor 110, e.g., a surface of the power transistor 110, to control heat generation of the power transistor 110 and turns on/off of the power transistor 110 according to the temperature of the power transistor 110. Operation of the MIT device 150 will be described in more detail below.

First, the MIT device undergoes rapid metal-insulator transition (MIT) at a threshold voltage or a threshold temperature such that it transitions from an insulator to a metal or from a metal to an insulator.

Thus, during a normal situation in which the power transistor 110 does not generate heat, the MIT device 150 transitions to an insulator, and accordingly, the power transistor 110 is turned on to supply power to the drive device 130 as the voltage of the base of the power transistor 110 becomes higher than the voltage of its collector connected to the drive device 130.

If the power transistor 110 generates heat and its temperature increases above a threshold temperature, the MIT device 150 transitions to a metal, the voltage of the base of the power transistor 110 being approximately 0 V. Thus, the voltage of the base of the power transistor 110 becomes lower than the voltage of its collector, turning off the power transistor 110, and therefore, supply of power to the drive device 130 is stopped. If supply of power is stopped, i.e., if flow of current is stopped, the power transistor 110 also stops generating heat and starts to cool.

If the power transistor 110 cools below a threshold temperature, the MIT device 150 transitions to an insulator again, and accordingly, the power transistor 110 is turned on to supply normal power to the drive device 130 again.

In this way, heat generation of the power transistor 110 can be semi-permanently controlled using the MIT device 150 that undergoes rapid metal-insulator transition at a threshold temperature, without replacement of the MIT device 150. Accordingly, the drive device 130 and a system connected to the power transistor 110 can be safely protected.

However, when the power transistor generates too much heat or a plurality of power transistors are used instead of one power transistor, heat generated by the power transistor 110 may not be effectively reduced through the MIT device 150.

According to the invention, heat generated by the power transistor 110 is reduced further using a small-sized heat sink together with the MIT device 150, which will be described in more detail below.

Figure 2:
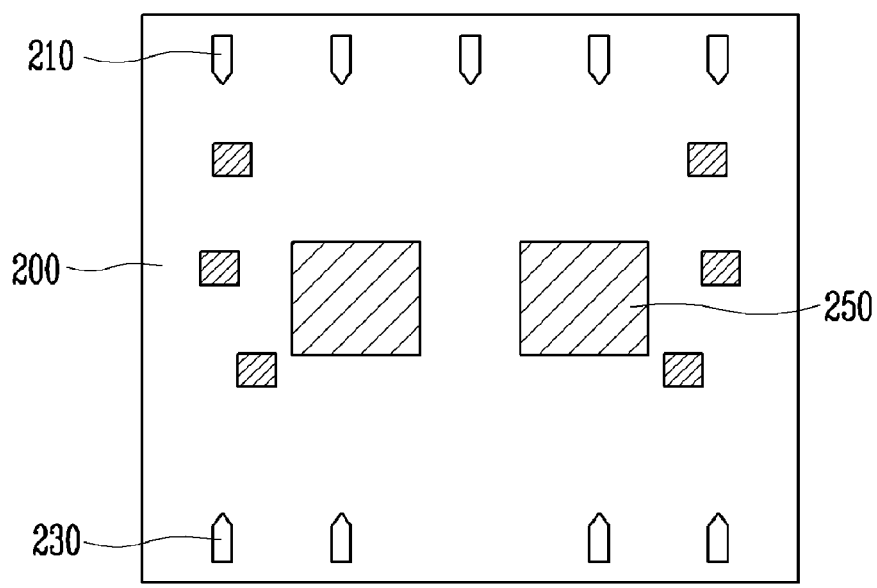
FIG. 2 is a view illustrating the structure of a printed circuit board in a power device package according to the exemplary embodiment of the invention.
Figure 3:
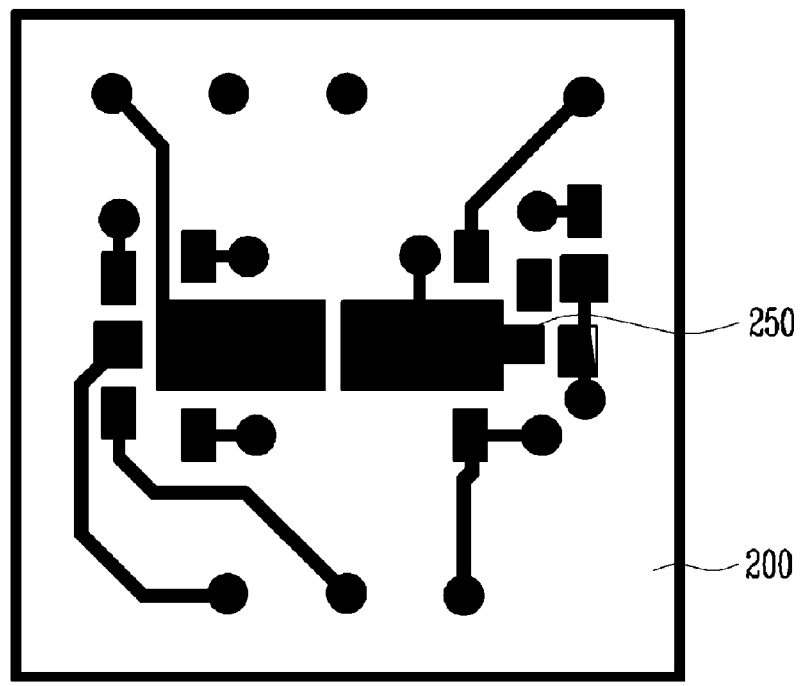
FIG. 3 is a view illustrating an example of actually realizing the printed circuit board of FIG. 2.

FIG. 2 is a view illustrating the structure of a printed circuit board in a power device package according to an exemplary embodiment of the invention. FIG. 3 is a view illustrating an example of actually realizing the printed circuit board of FIG. 2.

Referring to FIGS. 2 and 3, bonding pads 250 for mounting a plurality of devices are soldered to a printed circuit board 200.

A plurality of first signal input terminals 210 are disposed adjacent to one of lateral side surfaces of the printed circuit board 200, and a plurality of second signal input terminals 230 are disposed at positions opposite to the first signal input terminals 210.

The first signal input terminals 210 and the second signal input terminals 230 are electrically connected to the bonding pads 250 soldered to the printed circuit board 200.

That is, the signal input terminals 210 and 230 for applying signals are not formed within the printed circuit board 200 but are disposed adjacent to the lateral side surfaces.

Therefore, if the power transistors 110 are arranged adjacent to each other in a certain region of the printed circuit board 200 and the small-sized heat sink is formed only in one region on the power transistors 110 using the structure of the printed circuit board 200, the small-sized heat sink can effectively reduce heat generated by the power transistors 110 together with the MIT device 150.

Figure 4:
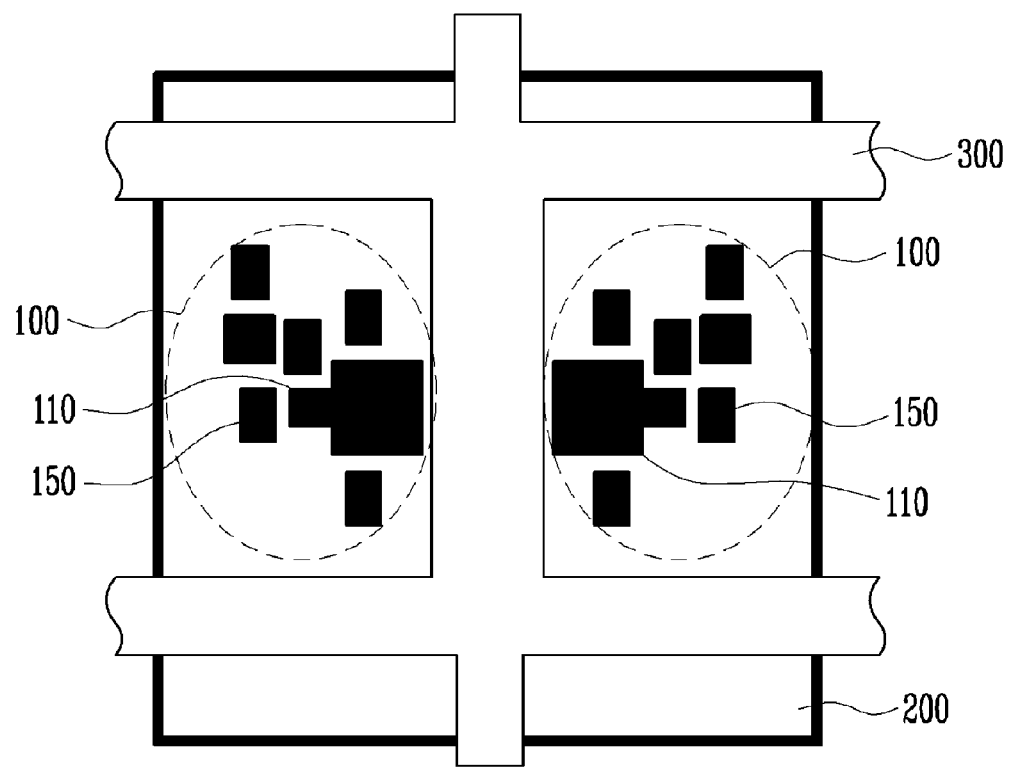
FIG. 4 is a plan view of a power device package in which a plurality of power transistors are mounted on the printed circuit board of FIG. 2.
Figure 5:
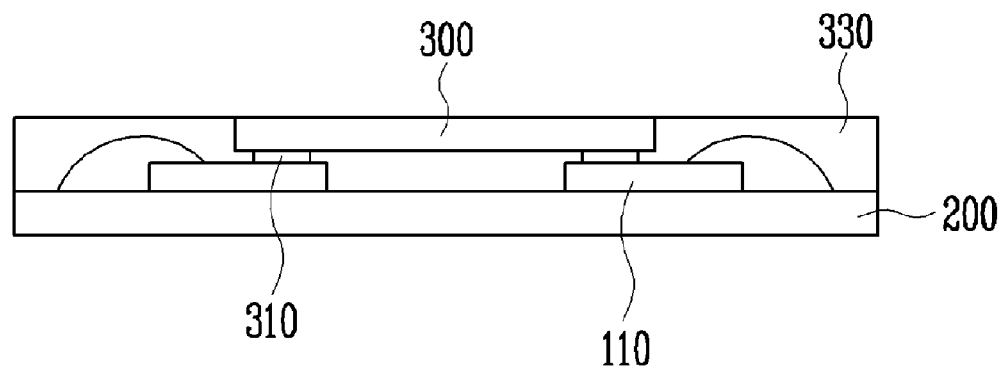
FIG. 5 is a view illustrating the power device package of FIG. 4.

FIG. 4 is a plan view of a power device package in which a plurality of power transistors are mounted on the printed circuit board of FIG. 2. FIG. 5 is a view illustrating the power device package of FIG. 4.

Referring to FIGS. 4 and 5, power transistors 110 for supplying power to other devices are mounted in a certain region of a printed circuit board 200 and are electrically connected to the printed circuit board 200 through bonding wires.

MIT devices 150 for controlling generation of heat are connected to the power transistors 110 respectively, and in particular, a heat sink 300 is integrally formed across one region on the power transistors 110.

The heat sink 300 is connected to the power transistors 110 by a bonding means 310 such as epoxy or bonding tape to emit heat generated by the power transistors 110 to the outside. The heat sink 300 preferably does not cover the entire top of the power transistors 110 but is integrally formed across one region on the power transistors 110.

All regions of the printed circuit board 200 except for the upper side of the heat sink 300 are preferably molded with an epoxy compound 330.

In this way, since heat generation of the power transistors 110 is effectively managed using the semi-permanent MIT devices 150 instead of fuses, and heat generated by the power transistors 110 is further reduced through the small-sized heat sink 300, heat generated by a plurality of power transistors 110 can also be effectively controlled.

Although the power transistors and the MIT devices are separately formed on different bonding pads in the above exemplary embodiment of the invention, the power transistors and the MIT devices may be formed in one chip.

Further, although the printed circuit board is single-layered in the above exemplary embodiment of the invention, it may be multi-layered when many devices need to be mounted on the printed circuit board.

According to the invention, a power device package controls heat generation of a power device using a semi-permanent metal-insulator transition (MIT) device instead of a fuse, and emits heat generated by the power device through a small-sized heat sink provided only in one region on the power device, thereby ensuring excellent dissipation of heat.

Therefore, the power device package can be usefully applied to any electric/electronic circuit using a power device, such as a mobile phone, a laptop computer, a battery charging circuit, a motor control circuit, a power control circuit of an electric/electronic device, a power supply, a power amplifier including audio equipment, and an internal circuit of an integrated function IC including a microprocessor.

Moreover, since the MIT device applied to the power device package can be semi-permanently used without replacement, time and cost problems caused by use of an existing fuse can be solved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A power device package having enhanced heat dissipation, comprising:
    a printed circuit board in which signal input terminals for applying signals are provided adjacent to lateral side surfaces;
    a power device mounted in a designated region of the printed circuit board to supply power;
    a metal-insulator transition (MIT) device attached to a heat generating part of the power device to control heat generation of the power device; and
    a heat sink provided in a region on the power device.

2. The power device package of claim 1, wherein when a plurality of power devices are mounted on the printed circuit board, the power devices are arranged adjacent to each other only in a designated region of the printed circuit board.

3. The power device package of claim 2, wherein the heat sink is integrally formed across a region on the power devices.

4. The power device package of claim 3, wherein the heat sink is bonded to upper portions of the power devices using a bonding means to emit heat generated by the power devices to the outside.

5. The power device package of claim 1, wherein a plurality of first signal input terminals are disposed adjacent to one of the lateral side surfaces of the printed circuit board, and a plurality of second signal input terminals are disposed at positions opposite to the first signal input terminals.

6. The power device package of claim 5, wherein the first signal input terminals and the second signal input terminals are electrically connected to a bonding pad soldered to the printed circuit board and the power device and the MIT device are mounted onto the bonding pad.

7. The power device package of claim 6, wherein the printed circuit board is single-layered or multi-layered.

8. The power device package of claim 1, wherein the power device is a power transistor and the MIT device is connected to a base of the power transistor.

9. The power device package of claim 8, wherein the MIT device undergoes rapid metal-insulator transition at a threshold temperature to thereby control turning on/off of the power transistor and heat generation of the power transistor.

* * * * *